United States Patent
Schut et al.

(10) Patent No.: US 7,149,155 B2
(45) Date of Patent: Dec. 12, 2006

(54) CHANNELED DIELECTRIC RE-RECORDABLE DATA STORAGE MEDIUM

(75) Inventors: David M. Schut, Philomath, OR (US); Alexander Govyadinov, Corvallis, OR (US); Thomas Novet, Corvallis, OR (US); Paul H McClelland, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 556 days.

(21) Appl. No.: 10/251,568

(22) Filed: Sep. 20, 2002

(65) Prior Publication Data

US 2004/0057372 A1  Mar. 25, 2004

(51) Int. Cl.
*G11B 11/00* (2006.01)

(52) U.S. Cl. .................. 369/13.54; 369/126

(58) Field of Classification Search .............. 369/126, 369/100, 101, 288, 275.2, 13.54; 428/472.2, 428/128, 618, 597, 675, 690; 361/529, 684, 361/685, 737, 797, 760; 365/118, 128, 151
See application file for complete search history.

(56) References Cited

U.S. PATENT DOCUMENTS

| | | | |
|---|---|---|---|
| 4,005,452 A * | 1/1977 | Cook, Jr. ................ 438/359 |
| 4,290,843 A | 9/1981 | Korenstein et al. |
| 5,357,399 A * | 10/1994 | Salisbury ................ 361/529 |
| 5,557,596 A * | 9/1996 | Gibson et al. .......... 369/101 |
| 5,879,955 A * | 3/1999 | Gonzalez et al. ........ 438/128 |
| 6,045,677 A | 4/2000 | Beetz, Jr. et al. |
| 6,243,348 B1 * | 6/2001 | Goodberlet ............... 369/101 |
| 6,258,463 B1 * | 7/2001 | Corridan .................. 428/472.2 |
| 6,274,463 B1 * | 8/2001 | Chaiken ................... 438/486 |
| 6,404,647 B1 * | 6/2002 | Minne' ..................... 361/760 |
| 6,423,621 B1 * | 7/2002 | Doan et al. .............. 438/597 |
| 6,607,974 B1 * | 8/2003 | Harshfield ................ 438/618 |
| 6,696,355 B1 * | 2/2004 | Dennison .................. 438/597 |
| 6,700,852 B1 * | 3/2004 | Yamamoto et al. ....... 369/100 |

* cited by examiner

*Primary Examiner*—Thang V. Tran
*Assistant Examiner*—Kim-Kwok Chu

(57) ABSTRACT

A re-recordable data storage medium is disclosed. One embodiment of the medium includes a dielectric material and a filler material. The dielectric material is organized in columnar channels over which memory cells are logically distributed. The filler material is within the columnar channels to realize the memory cells. The filler material of each memory cell has at least a first configuration and a second configuration. The first configuration corresponds to a first storable logical value, and the second configuration corresponds to a second storable logical value.

40 Claims, 6 Drawing Sheets

CHANNELED DIELECTRIC RE-RECORDABLE DATA STORAGE MEDIUM

BACKGROUND OF THE INVENTION

Storage media for computers and other types of electronic devices generally come in two types: volatile memory and non-volatile memory. Volatile memory loses its contents when power is no longer being supplied to the memory, whereas non-volatile memory maintains its contents even when power is not being supplied to the memory. The most common type of volatile memory is random-access memory (RAM), which is most commonly available as and implemented as an integrated circuit (IC). The term data storage medium is used herein in a broad sense, and encompasses IC memory, as well as other types of data storage media.

By comparison, non-volatile memory has perhaps more commonly been available as and implemented as magnetic and optical media, including hard disk drives, floppy disks, compact disc read-only memories (CD-ROM's), CD re-writable (CD-RW) discs, and digital versatile discs (DVD's), among others. Historically, non-volatile memory implemented as an IC was primarily available as ROM that was not re-recordable, such as hard-wired ROM and programmable ROM (PROM). More recently, IC non-volatile memory has become available as various types of flash memory, which is more technically known as electrically erasable PROM (EEPROM).

IC-based data storage media is typically read from and, where applicable, written to, using electric signals. By comparison, magnetic and optical data storage media is typically read from, and where applicable, written to, using magnetic sensors and optical sensors, where the latter usually include some type of illuminating beam. However, a new type of data storage medium has been contemplated that can be implemented as an IC, but that is read from and written to using an illuminating beam. A phase-changeable layer is present that can be switched between two different phases by being subjected to the illuminating beam. The two phases correspond to different logical values, such as binary one and binary zero.

For reading the logical value stored in the phase-changeable layer, the medium is subjected to the illuminating beam at a low intensity. This induces current within the medium, which is then detected and correlated with the current phase of the re-recordable storage medium to determine the logical value stored in the medium. However, current may potentially leak from one memory cell of the medium to another, causing errors.

For writing a logical value to the phase-changeable layer, the medium is subjected to the illuminating beam at a high intensity. This causes the phase-changeable layer to switch from one phase to the other phase. However, the power needed to change the phase potentially may be relatively large, making the medium less desirable for environments in which power is a scarce resource.

For these and other reasons, there is a need for the present invention.

SUMMARY OF THE INVENTION

The invention relates to a re-recordable data storage medium. One embodiment of the medium includes dielectric material and filler material. The dielectric material is organized in columnar channels over which memory cells are logically distributed. The filler material is within the columnar channels to realize the memory cells. The filler material of each memory cell has at least a first configuration and a second configuration. The first configuration corresponds to a first storable logical value, and the second configuration corresponds to a second storable logical value.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Overview

Figure 1A:
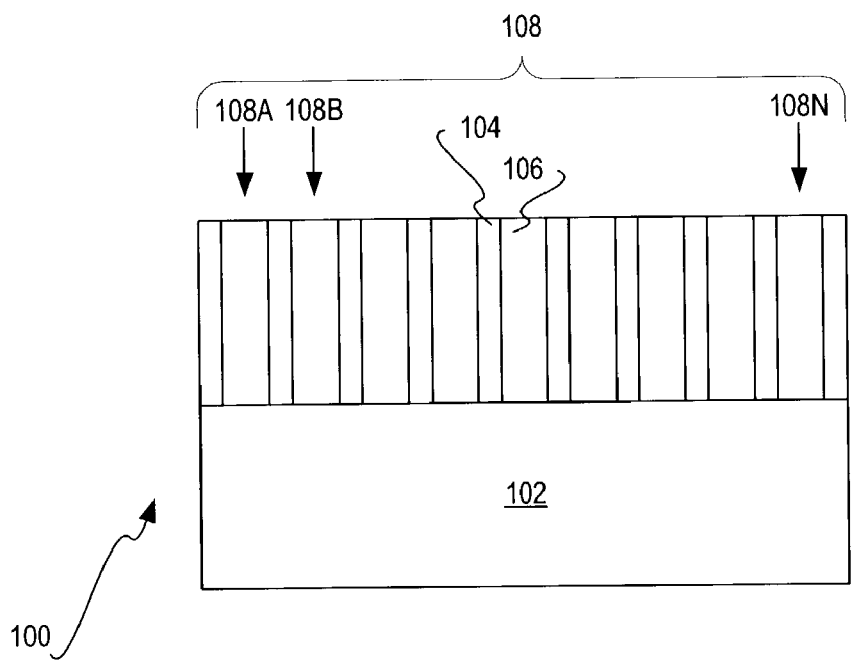
FIGS. 1A and 1B are diagrams showing a side view and a top view, respectively, of a re-recordable data storage medium, according to an embodiment of the invention.
Figure 1B:
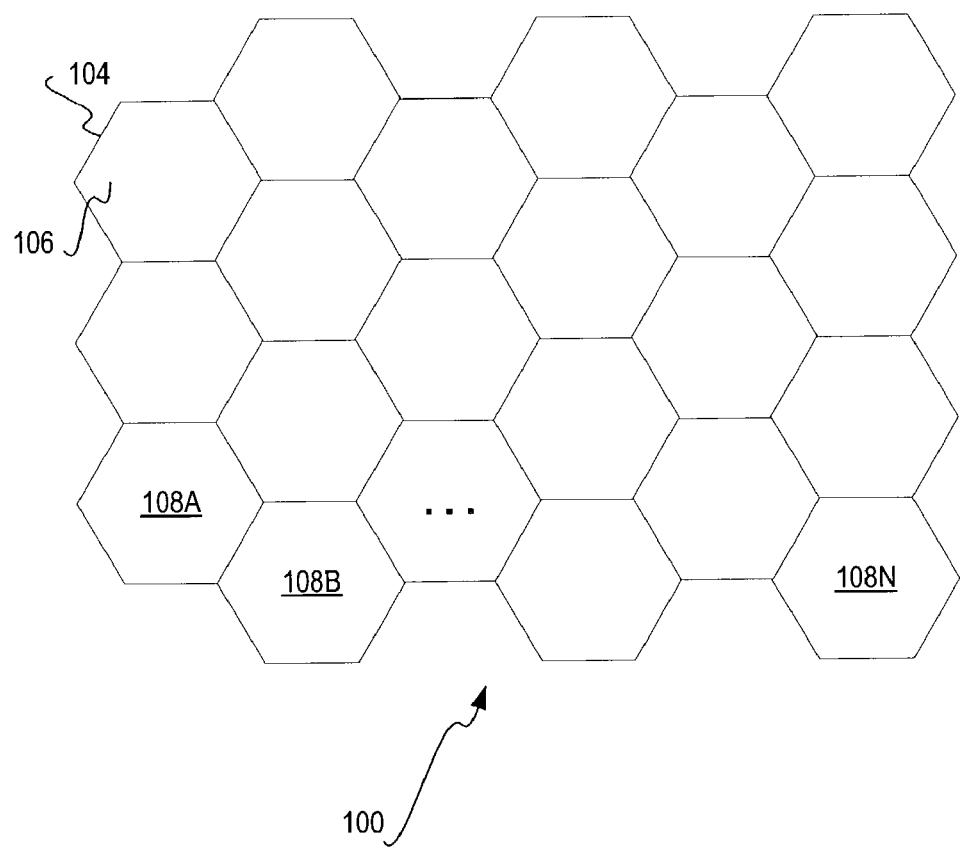

FIGS. 1A and 1B show a side view and a top view, respectively, of a re-recordable data storage medium 100, according to an embodiment of the invention. The medium 100 may be implemented as an integrated circuit (IC) and/or an electronic device, as well as other types of devices. The medium 100 in one embodiment has a substrate 102 that may be silicon or another material, and which can include the electronic and driving circuitry for the medium 100. Filler material 106 within dielectric material 104 is positioned over the substrate 102. The dielectric material 104 is organized into columnar channels 108, including the channels 108A, 108B, . . . , 108N.

The dielectric material 104 is a dielectric at least in the sense that it separates the filler material 106 as filled in different of the columnar channels 108. The filler material 106 is a filler at least in that it fills the columnar channels 108 into which the dielectric material 104 has been organized. The channels 108 thus are sidewalled by the dielectric material 104, and are at least substantially filled with the filler material 106.

Figure 2A:
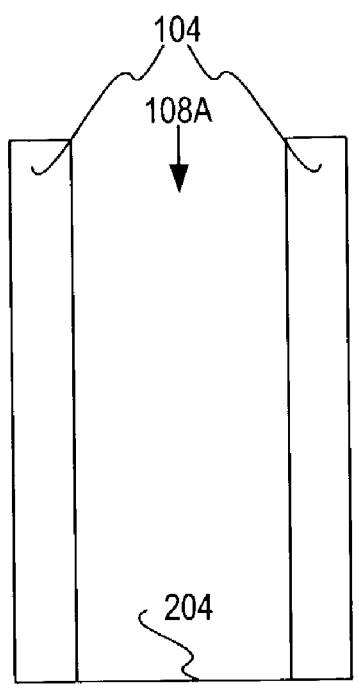
FIGS. 2A and 2B are diagrams showing different types of columnar channels of a re-recordable data storage medium, according to different embodiments of the invention.
Figure 2B:
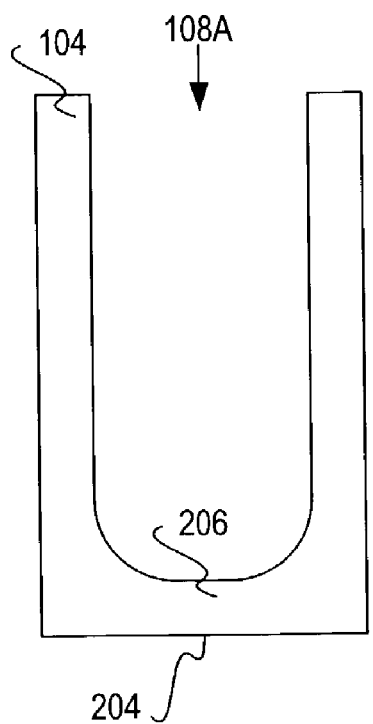

The dielectric material 104 may be a material that is anodized from its previous, non-anodized form, such that the resulting dielectric material 104 self-assembles into a cellular structure as the columnar channels 108. One such anodic material is alumina, or aluminum oxide, which is anodized from aluminum, specifically from porous anodic aluminum. The dielectric material 104 is thus a porous material, such that it has the columnar channels 108 into which the filler material 106 can be deposited. The channels 108 are columnar in that they extend at least substantially vertically from bottom to top. Whereas the channels 108 are shown in FIG. 1B as uniformly hexagonal in shape, in other embodiments they may have other shapes, either uniform or non-uniform.

Where the dielectric material 104 is an anodic material, the anodization process rendering the anodic material may result in at least two different types of the columnar channels 108, according to varying embodiments of the invention. This is shown in FIGS. 2A and 2B. In FIG. 2A, the columnar channel 108A is shown in which the dielectric material 104 has been anodized such that the channel 108A is at least substantially completely hollow. That is, the bottom 204 of the channel 108A does not contain any of the dielectric material 104. Conversely, in FIG. 2B, the columnar channel 108A is shown in which the dielectric material 104 has been anodized such that residual dielectric (anodic) material resides at the bottom 204 of the channel 108A, as indicated by the reference number 206.

Referring back to FIGS. 1A and 1B, the filler material 106 is within the dielectric material 104 to realize memory cells of the medium 100. The memory cells can have a one-to-one or a one-to-many correspondence with the columnar channels 108. That is, in one embodiment, each of the channels 108, as filled with the filler material 106, corresponds to a memory cell, whereas in another embodiment, a given memory cell may encompass more than one of the channels 108. The memory cells are thus distributed over the columnar channels 108 in a one-to-one or one-to-many fashion.

The filler material 106 of each memory cell, such as of each of the channels 108 in one embodiment, has at least two configurations corresponding to different storable logical values of the memory cell. For example, in a first configuration the filler material 106 may correspond to a logical value of zero, whereas in a second configuration the filler material 106 may correspond to a logical value of one. The dielectric material 104 separates the filler material 106 of different columnar channels 108, and thus, in one embodiment, the filler material 106 of different memory cells. In other embodiments of the invention, there may be more than two configurations, such that more than two different logical values may be stored.

The filler material 106 may in different embodiments be or include a phase-changeable material, a reduction-oxidation (redox) material, or another type of material. In the embodiment where the filler material 106 is a phase-changeable material, such material may be indium selenide, indium selenide telluride, or another phase-changeable material. Other types of phase-changeable material include, but to which embodiments of the invention are not limited, $Sb_2Se_xTe_y$ (x+y=3), GaSe, $Ga_2Se_xTe_y$ (x+y=3), InSe, $In_2Se_xTe_y$ (x+y=3), GeSbTe (GST), and AgGeSbTe. Still other phase-changeable materials include II-VI compounds, III-VI compounds, and ternary or quaternary compounds such as germanium antimony tellurium (GST) and silver germanium antimony tellurium. As has been indicated, embodiments of the invention are not limited to this list of phase-changeable materials, and, as can be appreciated by those of ordinary skill within the art, this list is not exhaustive. Such a phase-changeable material has at least two phases, including, for instance, an at least substantially amorphous phase and an at least substantially crystalline phase. The different phases correspond to the different configurations of the filler material 106.

In the embodiment where the filler material 106 includes a redox material, or component, the redox material may be gold nanoparticles, silver halide nanoparticles, metal phthalocyanine dyes, $Ru(bipy)_3$, $Fe(CO)_3L_2$, or another type of redox active material. The term "bipy" refers to 2,2'-bipyridyl ligand, whereas the term "$L_2$" refers to 2,3-bis(diphenylphosphino)maleic anhydride and similar bisphosphine bidentate ligands. Embodiments of the invention are not limited to this list of redox active materials, and, as can be appreciated by those of ordinary skill within the art, this list is not exhaustive. The redox material being reduced, such that it can be said that the redox material is in a reduced state, corresponds to one of the configurations of the filler material 106. Similarly, the redox material being oxidized, such that it can be said that the redox material is in an oxidized state, corresponds to another of the configurations of the filler material 106. In one embodiment, the redox material may be distributed throughout the filler material 106, where the filler material 106 effectively acts as a carrier of the redox material.

Embodiments Having Reduction-Oxidation (Redox) Materials

Figure 3:
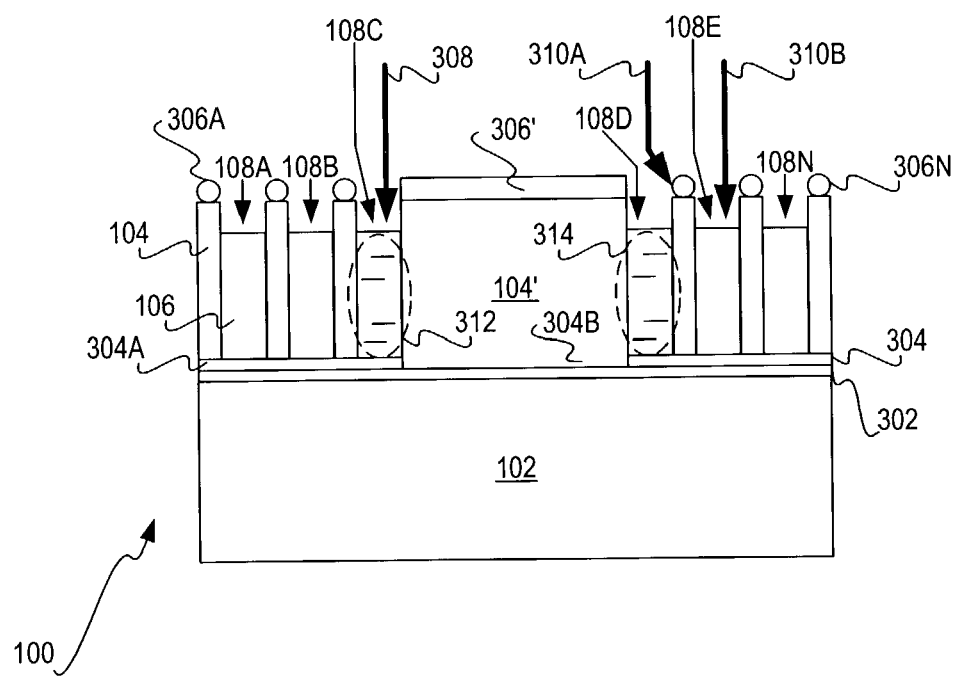
FIG. 3 is a diagram showing a re-recordable data storage medium in which a reduction-oxidation (redox) material is used to store different logical values, according to an embodiment of the invention, and that is consistent with the medium of FIGS. 1A and 1B.

FIG. 3 shows the re-recordable data storage medium 100, according to an embodiment in which a redox material is included within the filler material 106. On top of the substrate 102, an optional dielectric layer 302 and a conductive layer of blocks 304, such as metal, are present. The layer 302 may in one embodiment be patterned silicon oxide within the substrate 102 itself, where the dielectric layer 302 is not present, and where the substrate 102 is silicon. A conductive material 306 is deposited on the dielectric material 104, but not on the filler material 106, such as via a low-angle deposition approach. The material 306 thus includes the material 306A, 306B, 306C, 306D, . . . , 306N. The material 306 may be aluminum, gold, or another type of metal or conductive material, and promotes reading of the memory cells.

The conductive layer of blocks 304 is separably partitioned into conductive blocks, such as the blocks 304A and 304B, that assist erasure of the memory cells. Each of the conductive blocks encompasses a number of memory cells, such that the memory cells are organized into these blocks. For instance, where each of the columnar channels 108 corresponds to a separate memory cell, the block 304A encompasses the memory cells of the channels 108A, 108B, and 108C, and the block 304B encompasses the memory cells of the channels 108D, 108E, and 108N. The conductive layer of blocks 304 are thus also referred to as memory cell blocks. The dielectric layer 302 helps prevent shorting between the conductive layer of blocks 304.

The embodiment of FIG. 3 specifically shows the medium 100 where the dielectric material 104 is an anodic material, such as alumina. During the anodization process, only aluminum that is in contact with the conductive layer of blocks 304 is anodized into alumina. Therefore, the material 104' is aluminum, or partially anodized aluminum. A conductive material 306' is deposited on the material 104' when the conductive material 306 is deposited onto the dielectric material 104. The presence of the material 104' and the material 306' do not affect the operation of the medium 100, and are shown in FIG. 3 for illustrative completeness.

The memory cell of the columnar channel 108C is specifically shown in FIG. 3 as being written. During the writing process, the conductive material 306 and the conductive layer of blocks 304 are grounded. An illuminating beam 308, such as an electron beam, is applied to the filler material 106 of the columnar channel 108C. The beam is at high energy, such as 50–2000 electron-volts (eV) in one embodiment of the invention, depending on the type of redox material used. This reduces the redox material, or component, within the filler material 106, giving the filler material 106 a more negative charge, as indicated by the minus signs 312. That is, subjecting the filler material 106 of the channel 108C to the beam 308 switches the state of the redox material from an oxidized state to a reduced state. In this way, two different logical values can be stored in the memory cells of the columnar channels 108.

Once a memory cell of one of the columnar channels 108 has been written to by being placed in the reduced state, the cell can revert to the oxidized state, or erased, by a block-erasure process. For instance, the block-erasure process applied to the memory cell block 304A erases the memory cells of the channels 108A, 108B, and 108C, whereas the process applied to the block 304B erases the cells of the channels 108D, 108E, and 108N. The block-erasure process removes the negative charge stored in the filler material 106 of any of the memory cells, causing these memory cells to revert back to their oxidized states and store a different logical value than when they were in their reduced states.

As an example, to erase the memory cells of the columnar channels 108A, 108B, and 108C, the conductive material 306 is grounded, and the memory cell block 304A of the conductive layer of blocks 304 is biased at a high potential. This flushes the charge from the redox material within the filler material 106 within the channel 108C in particular, without affecting the filler material 106 within the channels 108A and 108B, which have not been written. The redox material within the filler material 106 within the channel 108C thus returns to the oxidized state. In this way, the memory cells of the columnar channels 108 can be block erased.

The memory cells of the columnar channels 108D and 108E are specifically shown in FIG. 3 as being read. During the reading process, the conductive layer of blocks 304 is grounded, and the signal at the conductive material 306 is detected. The illuminating beams 310A and 310B, such as electron beams, are applied to the filler material 106 of the columnar channels 108D and 108E. The beams 310A and 310B are at low energy, such as 20–2000 eV, in one embodiment of the invention, depending on the type of redox material being used. The memory cell of the channel 108D is currently in a reduced state, and thus has a more negative charge, as indicated by the minus signs 314. The memory cell of the channel 108E, conversely, is currently in an oxidized state, and thus has a less negative charge.

In the case of the memory cell of the columnar channel 108D, the beam 310A is deflected by the more negative charge of the filler material 106 within the channel 108D to the conductive material 306D. In the case of the memory cell of the columnar channel 108E, the beam 310B is not deflected, since the filler material 106 within the channel 108E is not as negatively charged. Therefore, when the memory cell of the channel 108D is being read, a larger signal, or larger current, is present at the conductive material 306 than when the memory cell of the channel 108E is being read. In this way, the two different logical values that can be stored in the memory cells of the columnar channels 108 can be distinguished from one another during reading.

Embodiments Having Phase-Changeable Materials

Figure 4:
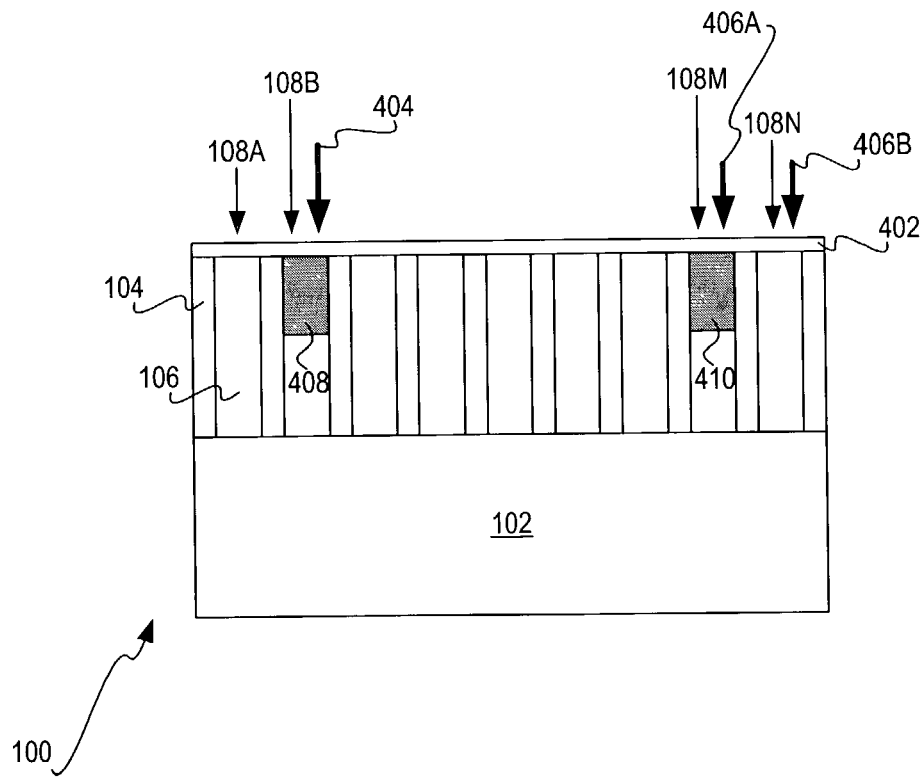
FIG. 4 is a diagram showing a re-recordable data storage medium in which a phase-changeable material is used to store different logical values, according to an embodiment of the invention, and that is consistent with the medium of FIGS. 1A and 1B.

FIG. 4 shows the re-recordable data storage medium 100, according to an embodiment of the invention in which the filler material 106 is a phase-changeable material. An optional conductive layer 402, such as metal, may be present on the dielectric material 104 and the filler material 106, and when present can promote reading and writing to the memory cells. The embodiment of FIG. 4 specifically shows the medium 100 where the memory cells map to the columnar channels 108, such as the channels 108A, 108B, . . . , 108M, 108N, on a one-to-one basis. However, the memory cells may also map to the channels 108 on a one-to-many basis, such that each cell encompasses more than one of the channels 108.

The memory cell of the columnar channel 108B is specifically shown in FIG. 4 as being written. An illuminating beam 404, such as an electron beam, is applied to the filler material 106 of the columnar channel 108B. The beam is at high power, using accelerating voltages such as 700–2000 eV, in one embodiment of the invention. This changes the phase of the phase-changeable material that is the filler material 106 of the columnar channel 108B. For instance, where the phase is amorphous, it is changed to crystalline, and vice-versa. The newly written (crystalline) phase of the filler material 106 is indicated in FIG. 4 by the shaded area 408. In this way, two different logical values can be stored in the memory cells of the columnar channels 108.

There is no separate erasure process per se in embodiments of the invention that utilize a phase-changeable material as the filler material 106. Rather, to erase a logical value that has been written to a memory cell, the columnar channel(s) of the cell are re-written, to revert back to their original phase. For example, to erase the memory cell of the columnar channel 108B, the illuminating beam 404 is re-applied to the filler material 106 of the channel 108B, which causes its phase to revert back to the original phase, such as from the amorphous phase to the crystalline phase.

The ending phase of the phase-changeable material, after it has been subjected to a beam of high energy, or power, depends on the rate at which the material is then cooled. To result in an amorphous phase, for instance, the phase-changeable material is cooled relatively quickly, to avoid giving the material sufficient time to crystallize. By comparison, to result in a crystalline phase, the phase-changeable material is cooled relatively slowly, to give the material sufficient time to crystallize.

The memory cells of the columnar channels 108M and 108N are specifically shown in FIG. 4 as being read. The illuminating beams 406A and 406B, such as electron beams, are applied to the filler material 106 of the channels 108M and 108N. The beams 406A and 406B are at low power, using accelerating voltages such as 700–2000 eV, in one embodiment of the invention. The phase of the memory cell of the channel 108M is currently crystalline, as indicated by the shaded area 410, whereas the phase of the memory cell of the channel 108N is currently amorphous.

The signal, such as the current, at the medium 100 when reading the memory cell of the columnar channel 108M is different than the signal at the medium 100 when reading the memory cell of the columnar channel 108N. This is because the memory cells of the channels 108M and 108N are at different phases. In this way, the two different logical values that can be stored in the memory cells of the columnar channels 108 can be distinguished from one another during reading. Further, the dielectric material 104 separates the filler material 106 of the different channels 108, substantially preventing shorting among adjacent memory cells during reading.

Method of Manufacture

Figure 5:
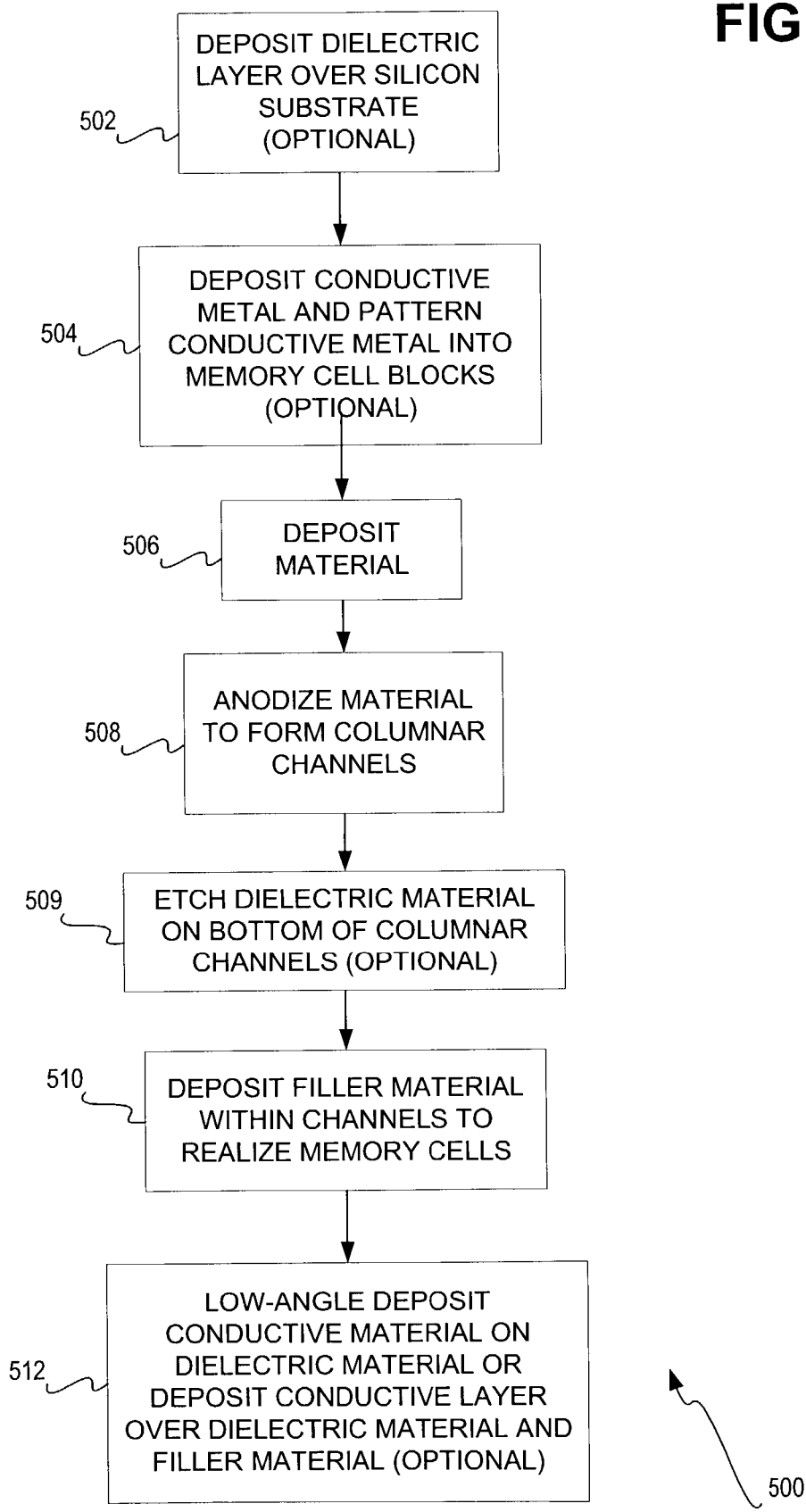
FIG. 5 is a flowchart showing a method for fabricating a re-recordable data storage medium, according to an embodiment of the invention.

FIG. 5 shows a method 500 for manufacturing a re-recordable data storage medium, according to an embodiment of the invention. The medium fabricated by performing the method 500 may be the medium 100 of one or more of the embodiments of FIGS. 1A–1B, 3, and 4. Some parts of the method 500 indicated as optional in FIG. 5 are particularly performed for fabricating the medium of the embodiment of FIG. 3 that utilizes a reduction-oxidation (redox) material within the filler material. Other parts of the method 500 indicated as optional in FIG. 5 are particularly performed for fabricating the medium of the embodiment of FIG. 4 that utilizes a phase-changeable material as the filler material.

In the case of fabricating a medium that utilizes a redox material, a dielectric layer is first optionally deposited or grown over a silicon substrate (502). A conductive metal layer is then deposited and patterned into memory cell blocks (504). For example, when the method 500 is used to fabricate the medium 100 of FIG. 3, the dielectric layer optionally deposited over the silicon substrate may be the dielectric layer 302 over the substrate 102. The conductive metal layer deposited and patterned into memory cell blocks may be the conductive layer of blocks 304 patterned into blocks 304A and 304B.

Referring back to FIG. 5, regardless of whether the medium being fabricated utilizes a redox material or a phase-changeable material, a metal is deposited (506), and anodized so that it self-assembles to form dielectric columnar channels (508). Examples of metals that can be so anodized include, but to which embodiments of the invention are not limited, aluminum, as well as alloys of aluminum, such as magnesium, tantalum, titanium, niobium, gallium, copper, and so on. Such aluminum and aluminum alloys can particularly be porous anodic aluminum and aluminum alloys, respectively. When the method 500 is used to fabricate the medium 100 of FIGS. 1A–1B, 3, and/or 4, the metal is deposited and, once anodized, forms an oxide material. As such, the metal becomes the dielectric material 104 and forms the organized, columnar channels 108. The dielectric material on the bottom of the columnar channels may optionally be etched (509). Filler material is then deposited within the channels to realize the memory cells (510). The filler material deposited within the channels to realize the memory cells may be the filler material 106, when the method 500 is used to fabricate the medium 100 of FIGS. 1A–1B, 3, and/or 4.

Referring back to FIG. 5, either a conductive material is low-angle deposited on the dielectric material, in the case where the medium being fabricated uses a redox material, or optionally a conductive layer is deposited over the dielectric material and the filler material, in the case where the medium being fabricated uses a phase-changeable material (512). For example, in the former case, when the method 500 is used to fabricate the medium 100 of FIG. 3, the conductive material may be the conductive material 306. As another example, in the latter case, when the method 500 is used to fabricate the medium 100 of FIG. 4, the conductive layer may be the layer 402.

Method of Use

Figure 6:
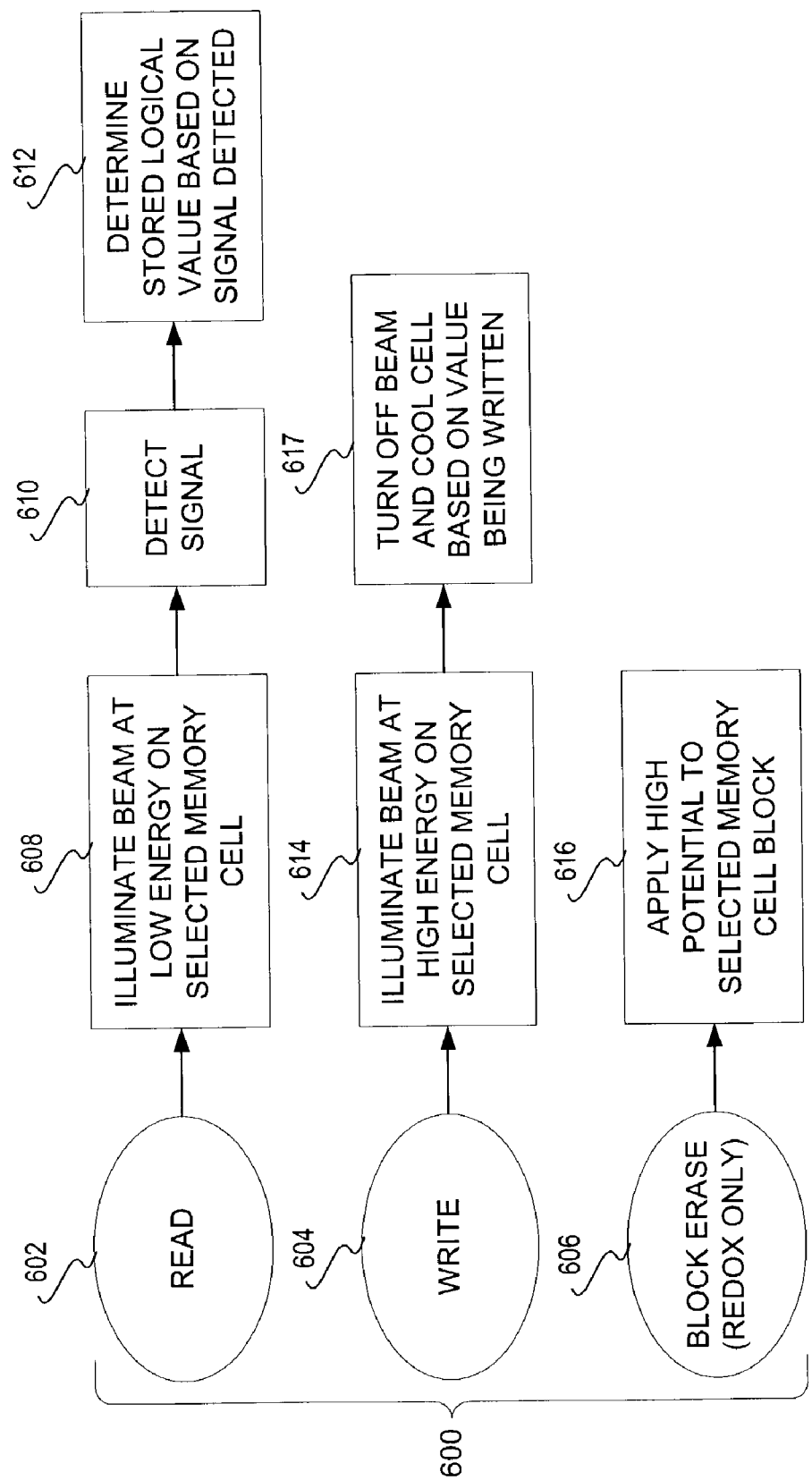
FIG. 6 is a flowchart showing a method for using a re-recordable data storage medium, according to an embodiment of the invention.

FIG. 6 shows a method 600 for using a re-recordable data storage medium 100, according to an embodiment of the invention. The medium used by performing the method 600 may be the medium 100 of one or more of the embodiments of FIGS. 1A–1B, 3, and 4. There are three particular actions that can be performed: a read action 602, a write action 602, and a block-erase action 606, the latter which is not applicable where the medium 100 does not use a reduction-oxidation (redox) material as part of the filler material.

In the read action 602, an illuminating beam, such as an electron beam, is illuminated on a selected memory cell of the medium at low energy (608). A signal resulting from the beam illuminating on the medium is then detected (610). The signal is different depending on the configuration of the filler material of the selected memory cell. For instance, the signal may be substantially equal to a first, lower signal value with one configuration of the filler material, and substantially equal to a second, higher signal value with another configuration of the filler material.

In the case of the filler material including a redox material, the signal is different depending on whether the redox material is in an oxidized or a reduced state. In the case of the filler material being a phase-changeable material, the signal is different depending on whether the phase-changeable material is in a crystalline or an amorphous phase. The different configurations of the filler material, such as the different states or phases of this material, correspond to different logical values being stored by the selected memory cell.

The stored logical value in the selected memory cell is thus determined based on the signal that has been detected (612). For example, the first, lower signal value may correspond to a logical value of zero being stored by the selected memory cell. The second lower, signal value would thus correspond to a logical value of one being stored by the selected memory cell.

In the write action 604, an illuminating beam, such as an electron beam, is illuminated on a selected memory cell of the medium at high energy (614). This causes the configuration of the filler material of the memory cell to change from one configuration to another configuration, representing a change in the logical value stored by the cell. In the case where the filler material includes a redox material, its state can be changed from oxidized to reduced, although not vice-versa. In the case where the filler material is a phase-changeable material, its phase may be changed from amorphous to crystalline, or vice-versa.

This phase change is controlled by the rate at which the beam is turned off, and accordingly the rate of cooling of the selected memory cell depending on the value to be written thereto (617). For example, the amorphous phase may correspond to one logical value, and the crystalline phase may correspond to another logical value. To have the phase-changeable material result in the amorphous phase, the material is cooled quickly, to not allow the material to have sufficient time to crystallize. By comparison, to have the phase-changeable material result in the crystalline phase, the material is cooled slowly, to allow the material to have sufficient time to crystallize.

The block-erase action 606 is applicable where the filler material of the memory cells of the medium include a redox material. A high potential is applied to a selected memory cell block that includes a number of memory cells to be erased (616). Any of the memory cells within the block that were in the reduced state are erased back to the oxidized state. Memory cells within the block that were already in the oxidized state do not change. The block-erase action 606 is not applicable where the filler material of the memory cells of the medium are phase-changeable material, in which case the memory cells can be individually changed by re-writing them with the write action 604.

Mass Storage Device

Figure 7:
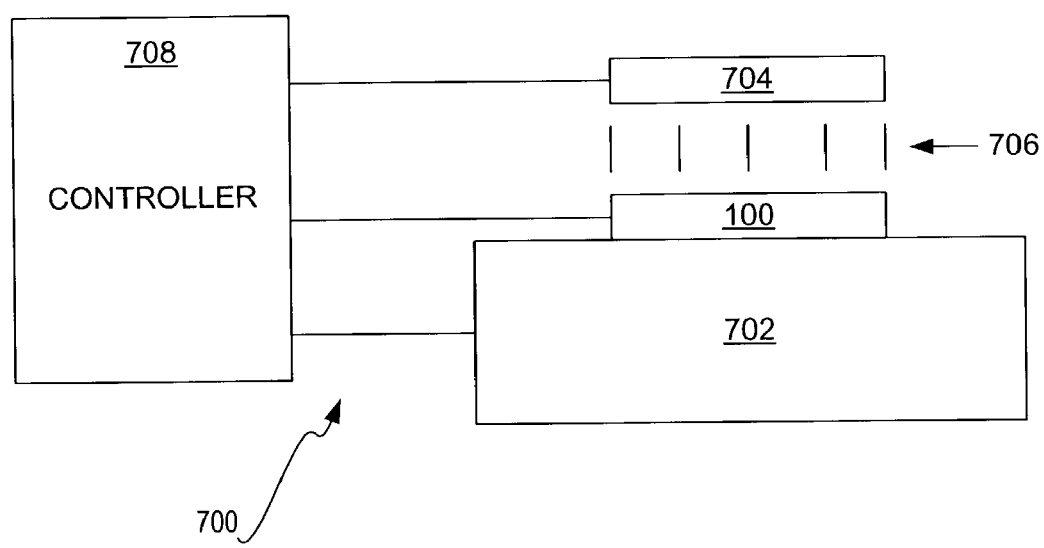
FIG. 7 is a diagram of a mass storage device, according to an embodiment of the invention.

FIG. 7 shows a diagram of a rudimentary mass storage device 700 that can be used to read data from and write data to the re-recordable data storage medium 100, according to an embodiment of the invention. The medium 100 may be the medium 100 of one or more of the embodiments of FIGS. 1A–1B, 3, and 4. The medium 100 is placed on a block 702. More generally, the block 702 is an instance of a mechanism that is receptive to the storage medium 100. An array of beam generators 704 corresponding to the memory cells of the medium 100 is positioned over the medium 100, where preferably each beam generator corresponds to a cell of the medium 100. The array of beam generators 704 may be a field array, or another type of array, of beam generators.

A controller 708 is able to selectively turn on and off individual beams 706 of the array 704, at varying desired intensities, for reading and writing logical values from and to memory cells of the medium 100. The controller 708 is also able to detect the signal at the medium 100, such as the current flowing through the storage medium 100, for reading logical values stored in memory cells of the medium 100, and able to bias different parts of the medium 100 as needed to read, write, or erase logical values of the memory cells of the medium 100. The controller 708 more generally is an instance of a mechanism for performing this functionality. The reading, writing, and erasing performed by the controller 708 may be accomplished in accordance with the method 600 of FIG. 6, as has been described.

CONCLUSION

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

We claim:

1. A re-recordable data storage medium comprising:
    a dielectric material organized in a plurality of columnar channels over which a plurality of memory cells is logically distributed,
    a filler material within the plurality of columnar channels of the dielectric material to realize the plurality of memory cells, the filler material of each memory cell having at least a first configuration corresponding to a first storable logical value and a second configuration corresponding to a second storable logical value;
    a substrate layer under the dielectric material;
    a conductive layer between the substrate layer and the dielectric material to assist selective erasure of a plurality of memory cell blocks in which the plurality of memory cells are organized; and,
    a dielectric layer between the substrate layer and the conductive layer to help prevent shorting among the memory cell blocks.

2. The medium of claim 1, wherein the dielectric material comprises an anodic material self-assembled into a cellular structure as the plurality of columnar channels.

3. The medium of claim 2, wherein the anodic material comprises alumina anodized from one of aluminum and an aluminum alloy.

4. The medium of claim 2, wherein the anodic material is anodized such that the plurality of columnar channels are substantially completely hollow.

5. The medium of claim 2, wherein the anodic material is anodized such that residual anodic material resides at bottoms of the plurality of columnar channels.

6. The medium of claim 1, wherein the dielectric material comprises a porous material having the plurality of columnar channels.

7. The medium of claim 1, wherein the filler material comprises a reduction-oxidation (redox) material, the redox material reduced in the first configuration and oxidized in the second configuration.

8. The medium of claim 1, wherein the filler material comprises a phase-changeable material having an at least substantially amorphous phase in the first configuration and an at least substantially crystalline phase in the second configuration.

9. The medium of claim 1, wherein the substrate layer contains electronic and driving circuitry.

10. The medium of claim 1, wherein the substrate layer is a silicon substrate layer.

11. The medium of claim 1, further comprising a conductive material deposited on the dielectric material to promote reading from the plurality of memory cells.

12. The medium of claim 1, further comprising a conductive layer over the dielectric material and the filler material within the dielectric material to promote reading from the plurality of memory cells.

13. The medium of claim 1, wherein each memory cell corresponds to one of the plurality of columnar channels of the dielectric material.

14. The medium of claim 1, wherein each memory cell corresponds to more than one of the plurality of columnar channels of the dielectric material.

15. An electronic device comprising the re-recordable data storage medium of claim 1.

16. An integrated circuit (IC) comprising the re-recordable data storage medium of claim 1.

17. A re-recordable data storage medium comprising:
    a substrate layer;
    an anodic dielectric material self-assembled into a cellular structure over the substrate layer as a plurality of columnar channels over which a plurality of memory cells is logically distributed;
    a phase-changeable material within the anodic dielectric material, the phase-changeable material of each memory cell having at least a first phase corresponding to a first storable logical value and a second phase corresponding to a second storable logical value;
    a conductive layer between the substrate layer and the anodic dielectric material to assist selective erasure of a plurality of memory cell blocks in which the plurality of memory cells are organized; and, a dielectric layer between the substrate layer and the conductive layer to help prevent shorting among the memory cells.

18. The medium of claim 17, wherein the anodic dielectric material comprises alumina anodized from one of aluminum and an aluminum alloy.

19. The medium of claim 17, further comprising a conductive layer over the anodic dielectric material and the phase-changeable material within the anodic dielectric material to promote reading from the plurality of memory cells.

20. A re-recordable data storage medium comprising:
a substrate layer;
a conductive layer separably partitioned into a plurality of memory cell blocks, each memory cell block encompassing a sub-plurality of a plurality of memory cells for simultaneous erasure thereof;
an anodic dielectric material self-assembled into a cellular structure over the conductive layer as a plurality of columnar channels over which the plurality of memory cells is logically distributed;
a dielectric material within the anodic dielectric material having a reduction-oxidation (redox) component, the redox component of each memory cell reducible to represent a first storable logical value and oxidizible to represent a second storable logical value; and,
a conductive material deposited on the anodic dielectric material to promote reading from and writing to the plurality of memory cells.

21. The medium of claim 20, wherein the anodic dielectric material comprises alumina anodized from one of aluminum and an aluminum alloy.

22. The medium of claim 20, wherein the redox component is selected from a group of redox components essentially consisting of: gold nanoparticles, silver halide nanoparticles, copper phthalocyanine dye, Ru(bipy)3, and Fe(CO)3L2.

23. The medium of claim 20, further comprising a dielectric layer between the substrate layer and the conductive layer to help prevent shorting among the plurality of memory cell blocks.

24. A re-recordable data storage medium constructed by performing a method comprising:
depositing a metal over a silicon substrate;
anodizing the metal into a dielectric material such that the dielectric material self assembles into a plurality of columnar channels; and,
depositing a filler material within the plurality of columnar channels to realize a plurality of memory cells, the filler material of each memory cell having at least a first configuration corresponding to a first storable logical value and a second configuration corresponding to a second storable logical value.

25. The medium of claim 24, the method further comprising, prior to depositing the dielectric material over the silicon substrate,
depositing a conductive metal over the silicon substrate; and,
patterning the conductive metal into a plurality of memory cell blocks, each memory cell block encompassing a sub-plurality of the plurality of memory cells.

26. The medium of claim 25, the method further comprising, prior to depositing the conductive metal over the silicon substrate, depositing a dielectric layer on the silicon substrate.

27. The medium of claim 24, the method further comprising low-angle depositing a conductive material on the dielectric material.

28. The medium of claim 24, the method further comprising depositing a conductive layer over the dielectric material and the filler material.

29. The medium of claim 24, wherein the metal comprises one of aluminum and an aluminum alloy, such that the dielectric material comprises alumina.

30. The medium of claim 24, where depositing the filler material comprises depositing the filler material including a reduction-oxidation (redox) material within the plurality of columnar channels, the redox material reduced in the first configuration and oxidized in the second configuration.

31. The medium of claim 24, where depositing the filler material comprises depositing a phase-changeable material within the plurality of columnar channels having an at least substantially amorphous phase in the first configuration and an at least substantially crystalline phase in the second configuration.

32. A method comprising performing at least one action selected from:
a read action comprising:
illuminating a beam at low energy on a re-recordable data storage medium having a dielectric material with a reduction-oxidation (redox) component within a channeled anodic dielectric material, charge of the beam deflected where the redox component is in a reduced state corresponding to a first storable logical value and not deflected where the redox component is in an oxidized state corresponding to a second storable logical value;
detecting a signal resulting from the beam illuminating the re-recordable data storage medium commensurate with deflection of the charge of the beam;
determining a currently stored logical value of the re-recordable data storage medium based on the signal detected;
a write action comprising illuminating the beam at high energy on the re-recordable data storage medium to reduce the redox component to the reduced state; and,
an erase action comprising applying a high potential to a conductive layer portion under the channeled anodic dielectric material to oxidize the redox component to the oxidized state.

33. The method of claim 32, wherein detecting the signal comprises detecting the signal as one of substantially a first signal corresponding to the redox component being in the reduced state, and a second signal corresponding to the redox component being in the oxidized state.

34. The method of claim 33, wherein determining the currently stored logical value comprises determining the currently stored logical value as the first storable logical value based on detecting the first signal, and as the second storable logical value based on detecting the second signal.

35. A method comprising performing at least one action selected from:
a read action comprising:
illuminating a beam at low energy on a re-recordable data storage medium having a phase-changeable material within a channeled anodic dielectric material, the phase-changeable material having an amorphous phase corresponding to a first storable logical value and a crystalline phase corresponding to a second storable logical value;
detecting a signal flowing through the re-recordable data storage medium;

determining a currently stored logical value of the re-recordable data storage medium based on the signal detected; and, a write action comprising illuminating the beam at high energy on the re-recordable data storage medium to cause the phase-changeable material to switch from the amorphous phase to the crystalline phase and vice-versa.

36. The method of claim 35, wherein detecting the signal comprises detecting the signal as one of substantially a first signal corresponding to the phase-changeable material being in the amorphous phase, and a second signal corresponding to the phase-changeable material being in the crystalline phase.

37. The method of claim 36, wherein determining the currently stored logical value comprises determining the currently stored logical value as the first storable logical value based on detecting the first signal, and as the second storable logical value based on detecting the second signal.

38. A mass-storage device comprising:

a first mechanism receptive to a re-recordable data storage medium having a filler material within an anodic dielectric material organized in a plurality of columnar channels over which a plurality of memory cells is logically distributed, the filler material of each memory cell having at least a first configuration corresponding to a first storable logical value and a second configuration corresponding to a second storable logical value; and, an array of beam generators corresponding to the plurality of memory cells, each beam generator capable of generating an illuminating beam at low energy to read from a corresponding memory cell and at high energy to write to the corresponding memory cell.

39. The device of claim 38, further comprising a second mechanism to read a currently stored logical value of a selected memory cell by controlling the beam generator corresponding to the selected memory cell to illuminate the selected memory cell at low energy, by detecting a signal induced through the selected memory cell, and by correlating the signal detected with the stored logical value of the selected memory cell.

40. The device of claim 38, further comprising a second mechanism to write a desired logical value to a selected memory cell by controlling the beam generator corresponding to the selected memory cell to illuminate the selected memory cell at high energy.

* * * * *